United States Patent [19]

Nakagawa et al.

[11] Patent Number: 4,760,431
[45] Date of Patent: Jul. 26, 1988

[54] GATE TURN-OFF THYRISTOR WITH INDEPENDENT TURN-ON/OFF CONTROLLING TRANSISTORS

[75] Inventors: Akio Nakagawa, Hiratsuka; Takashi Shinohe, Yokohama, both of Japan

[73] Assignee: Kabushiki Kaisha Toshiba, Kawasaki, Japan

[21] Appl. No.: 913,753

[22] Filed: Sep. 30, 1986

[30] Foreign Application Priority Data

Sep. 30, 1985 [JP] Japan .................. 60-214578
Apr. 24, 1986 [JP] Japan .................. 61-95418

[51] Int. Cl.$^4$ .................................. H01L 29/78
[52] U.S. Cl. ........................ 357/234; 357/30; 357/23.14; 357/38; 357/43; 357/86
[58] Field of Search .............. 357/23.4, 23.14, 43, 357/38, 20, 86; 307/633, 634, 635, 305

[56] References Cited

U.S. PATENT DOCUMENTS

| | | | |
|---|---|---|---|
| 4,224,634 | 9/1980 | Svedberg | 357/43 |
| 4,441,117 | 4/1984 | Zommer | 357/43 |
| 4,443,931 | 4/1984 | Baliga et al. | 357/38 |
| 4,547,791 | 10/1985 | Roger et al. | 357/23.4 |
| 4,580,154 | 4/1986 | Coe | 357/23.4 |
| 4,581,543 | 4/1986 | Herberg | 357/38 |
| 4,604,535 | 8/1986 | Sasayama et al. | 357/43 |
| 4,604,638 | 8/1986 | Matsuda | 357/38 |
| 4,636,830 | 1/1987 | Bhakat | 357/38 |

FOREIGN PATENT DOCUMENTS 2524711 10/1983 France .................. 357/38 T
55-121682 9/1980 Japan .................. 357/23.4

OTHER PUBLICATIONS

V. A. K. Temple, "MOS Controlled Thyristors (MCT'S)" IEEE IEDM Tech. Digest, pp. 282-285 (1984).
M. St oisiek et al., "MOS GTO-A Turn Off Thyristor with MOS-Controlled Emitter Shorts", IEEE IEDM Tech. Digest, pp. 158-161 (1985).

Primary Examiner—Joseph E. Clawson, Jr.
Attorney, Agent, or Firm—Oblon, Fisher, Spivak, McClelland & Maier

[57] ABSTRACT

A gate turn-off thyristor has first and second MOSFETs serving as turn-on and turn-off controlling devices, respectively. A p type semiconductor layer is additionally formed in an n type substrate functioning as a first base in such a manner as to overlap a p type second base layer. The additional layer is different from the second base in impurity concentration, thereby causing the resistivity of the second base to be smaller than that of the additional layer. The first MOSFET has an n type source layer formed in the additional layer to define a surface portion of the additional layer positioned between the source layer and the first base layer as a channel region of the first MOSFET. A turn-on gate layer is provided to cover a surface region of the first base and the channel region of the first MOSFET.

4 Claims, 8 Drawing Sheets

F I G. 9
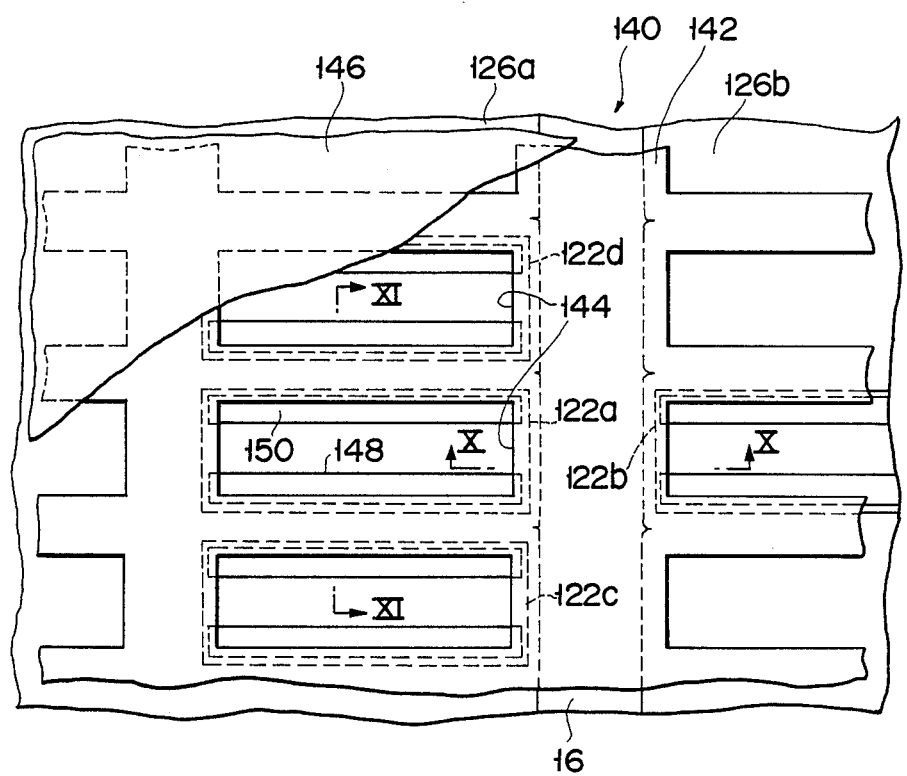

GATE TURN-OFF THYRISTOR WITH INDEPENDENT TURN-ON/OFF CONTROLLING TRANSISTORS

BACKGROUND OF THE INVENTION

The present invention relates to a gate turn-off thyristor and, more particularly, to a gate turn-off thyristor having independent transistor elements for controlling the turn-on and turn-off of the thyristor.

Heretofore, it is known to provide, in addition to a turn-on controlling transistor element, a transistor element for exclusively controlling the turn-off of high power gate turn-off thyristors (GTO thyristors). For example, according to V. A. K. Temple, "MOS CONTROLLED THYRISTORS (MCT'S)" IEEE IEDM Tech. Digest, pages 282-285 (1984), a GTO thyristor having an n-channel turn-on controlling FET and a p-channel turn-off controlling FET is disclosed in FIG. 4 of this reference. In this thyristor, the p-channel FET is switched to a conductive state in response to a drive voltage application to a gate electrode, and the n type emitter layer and the p type base layer of the GTO thyristor are electrically short-circuited therebetween, thereby controlling the turn-off of the thyristor.

According to the GTO thyristor, it is, however, difficult to effectively control the turn-off operation. This is because the turn-off current hardly flows due to a lateral resistance inherent in a p type base layer in the region of the p type base layer (e.g., the central portion of the GTO thyristor) relatively remote from a channel region (off-channel) where the turn-off current initially starts flowing, resulting that the turn-off is delayed in this region. More specifically, according to this example, the surface portion of the p type base layer, which becomes conducted when the GTO thyristor is turned off with the p type region (formed in the n type emitter layer) of high impurity concentration via the off-channel, functions also as a turn-on channel. In other words, the surface portion of the p type base layer of low impurity concentration is used directly as the on-channel of the turn-on controlling FET. Therefore, it is not allowed to alter the resistivity of the turn-on channel to a low value. Because, if the impurity concentration of the surface portion of the p type base layer is high enough to reduce the resistivity of the p type base layer, the threshold voltage level of the turn-on channel increases, thereby making it impossible to drive the turn-on of the thyristor effectively.

Further, according to the conventional GTO thyristor with the turn-on and turn-off controlling FETs, its withstand voltage cannot be enhanced as required. In the thyristor, it is necessary to set the resistivity of the n type base layer to a relatively high value (i.e., low impurity concentration) in order to enhance the withstand voltage of the thyristor. However, if this is so, the resistivity for the turn-off current will inevitably increase, thereby reducing the current capacity at the turn-on time.

SUMMARY OF THE INVENTION

It is therefore an object of the present invention to provide a new and improved gate turn-off thyristor which can be effectively driven to turn-on and turn-off at a high speed and has excellent basic characteristics such as gate sensitivity and current capacity.

In order to attain the above object, the invention is addressed to a specific gate turn-off thyristor which includes first and second field effect transistors as gate turn-on/off controlling switching devices. A semiconductive substrate of a first conductivity type serves as a first base layer of the thyristor. First emitter layer and second base layer of a second conductivity type are essentially formed on the opposed surfaces of the substrate. A first base layer has a surface region which is in contact with the second base layer. A second emitter layer of the first conductivity type is formed in the second base layer. An additional semiconductor layer of the second conductivity type is formed in the first base layer so as to overlap with the second base layer. This additional semiconductor layer is different from the second base layer in an impurity concentration, whereby the second base layer has smaller resistivity than the additional layer. The second base layer has a surface region interposed between the additional layer and the second emitter layer.

The first field effect transistor functions as a turn-on controlling transistor for drivinq on the thyristor in response to an external voltage. The turn-on controlling transistor has a source layer, formed in the additional layer to define the portion of the additional layer disposed between itself (source layer) and the first base layer as a channel region of the first transistor, and a gate layer, i.e., an ON-gate layer formed insulatively above the substrate to at least partially cover the surface region of the first base layer and the channel region of the first transistor. On the other hand, the second field effect transistor functions as a turn-off controlling transistor for driving off the thyristor by short-circuiting the second base layer and the second emitter layer in response to an external drive voltage. The turn-off controlling transistor has a gate layer, i.e., an OFF-gate layer formed insulatively above the substrate to at least cover the surface region of the second base layer. When the thyristor is turned off, the turn-off current flows in the second base layer lower in resistivity than the additional layer.

The invention, and its objects and advantages, will become more apparent in the detailed description of preferred embodiments presented below.

BRIEF DESCRIPTION OF THE DRAWINGS

In the detailed description of a preferred embodiment of the invention presented blow, reference is made to the accompanying drawings in which:

FIGS. 6 and 9 are plan views of GTO thyristors according to third and fourth embodiments of the invention;

DETAILED DESCRIPTION OF PREFERRED EMBODIMENTS

Figure 1:
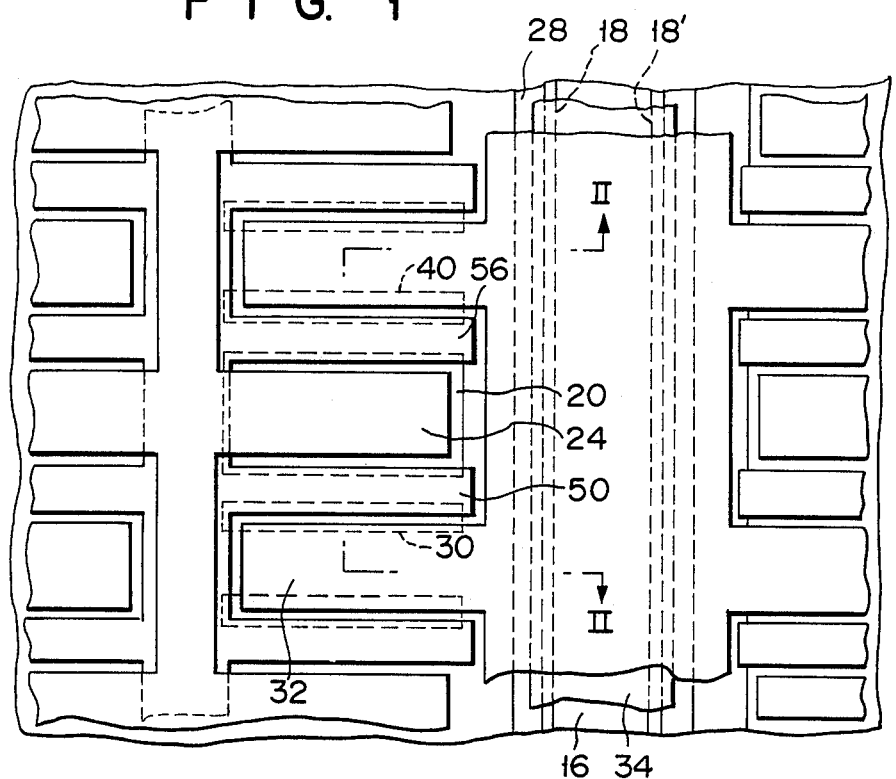
FIG. 1 shows in plan main parts of a gate turn-off (GTO) thyristor having turn-on/off controlling MOSFETs of the same channel type in accordance with a first embodiment of the invention.
Figure 2:
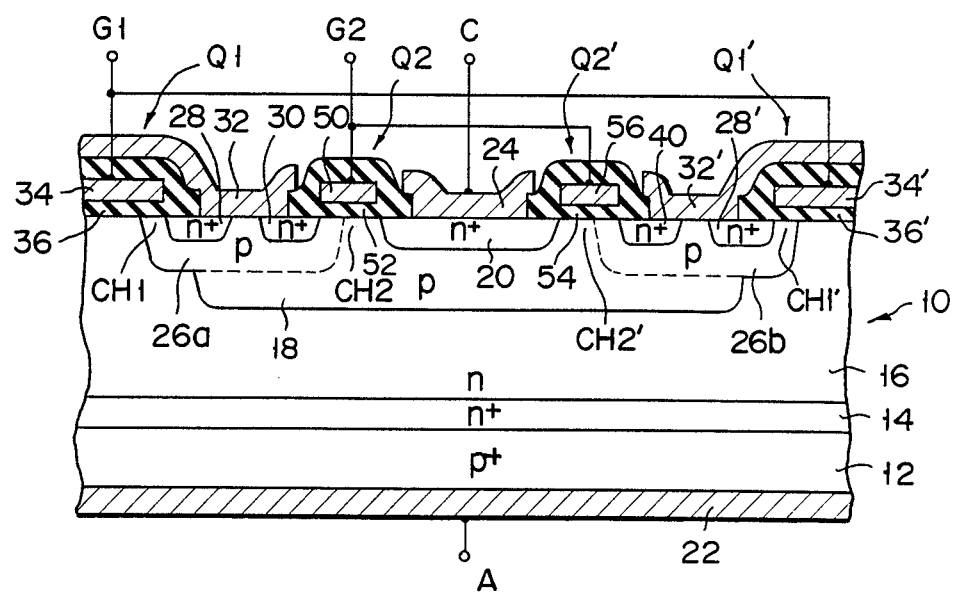
FIG. 2 is a sectional view of the GTO thyristor as taken along line II—II of FIG. 1 (not drawn to scale)

Referring now to FIGS. 1 and 2, there is shown a gate turn-off thyristor or GTO thyristor 10 of a first embodiment of the present invention. FIG. 2 shows in plan the sectional construction of a GTO thyristor as taken along U-shaped line II—II of FIG. 1. In FIG. 2, insulation layers are omitted from the illustration so as to make it easy to understand visually the essential portion of a complicated plan construction of the device.

As shown in FIG. 2, GTO thyristor 10 has a conventional "pnpn laminated layer structure" formed of p type emitter 12, n type bases 14 and 16, p type base 18 (or 18') and n type emitter 20. The p type base of thyristor 10 is divided, as shown in FIG. 1, into two p type layers 18 and 18' (the surface region of a linear n type base is exposed therebetween). N type emitter 20 is divided, as shown in FIG. 1, into a plurality of layer components having a rectangular slender planar shape. Conductive layer 22 is formed on emitter 12, and serves as anode electrode A (first main electrode). Conductive layer 24 has a layer component formed on emitter 20, and is conducted directly with emitter 20 to thereby serve as cathode electrode C (second main electrode).

Thyristor 10 has MOSFETs Q1 and Q2 for independently controlling the turn-on/off of the thyristor. Turn-on controlling MOSFETs Q1 and Q1' are respectively formed in p type semiconductive layers 26a and 26b additionally formed in the peripheral region of p type base 18 of thyristor 10. The layers 26 are shallower than p type base 18, and their resistivity is set to be larger than that of layer 18 of the body of thyristor 10. Layers 26 are formed, after the diffusing step of the impurity in the layer 16 for forming base 18, by diffusing the same conductivity type of impurity in layer 16 at different impurity concentration (smaller impurity concentration). Therefore, layers 26 can function substantially as part of the p type base of thyristor 10.

N type semiconductive layers 28 and 30 of high concentration are formed in space in layer 26a. Layer 28 is linearly extended along the peripheral edge of the p type base (and hence parallel with the short sides of emitter 20 of rectangular slender shape). Layer 30 is extended vertically to layer 28 to become parallel to the long sides of emitter 20. Conductive layer 32 is formed on p type base 26a so as to electrically connect layers 28 and 30 and to short-circuit additional p type base layer 26. Layer 32 thus functions as the source electrode (or amplifying gate electrode) of MOSFET Q1. Conductive layer 34 is formed above base 16 so as to cover the surface region of n type base 16 between p type bases 18 and 18'. Layer 34 is insulated from layers 16, 18, 26 and 28 by gate insulation layer 36. Thus, conductivity modulation type n channel MOSFET Q1 is constituted which has n+ type layer 28 as a source, conductive layer 34 as a turn-on controlling gate (hereinafter abbreviated to "ON-gate") and an upper surface region of layer 26a disposed directly under layer 36 as channel region CH1.

N+ type semiconductive layers 28' and 40 are formed in layer 26b in a similar manner, and short-circuited with layer 26b (see FIG. 2) by electrode layer 32'. ON-gate layer 34' and gate insulation layer 26' are formed similarly to FET Q1 to obtain conductivity modulation type n channel MOSFET Q1' (in FIG. 2, layer 28' is the same as layer 28, but shown by a "dash" for the convenience of illustration. Similar comments are to be made with respect to layers 32', 34' and 36'.). ON-gates 34 and 34' of FETs Q1 and Q1' are connected to gate turn-on controlling gate terminal G1. An external drive voltage for controlling the turn-on of thyristor 10 is applied to terminal G1.

Turn-off controlling gate layer 50 (hereinafter abbreviated to "OFF-gate") is formed above layer 18 to extend along the long sides of a rectangular n type emitter and to substantially self-align with layers 20 and 30. OFF-gate layer 50 covers, as best depicted in FIG. 2, the surface regions of layers 26a and 18 disposed between n+ type emitter 20 and n+ type layer 30. OFF-gate layer 50 is insulated from layers 18, 20, 26, 30 by gate insulation layer 52. Therefore, n channel MOSFET Q2 is composed which has n+ type layer 30 as a drain, and the upper surface region of p type layers 18 and 26a, which is positioned between layers 20 and 30 and disposed directly under layer 52, as channel region CH2. MOSFET Q2 functions as a turn-off controlling transistor. (It is not always necessary that the right end of layer 26 shown in FIG. 2 extends to be positioned under layer 50. It is sufficient that layer 26 at least partially overlaps layer 30.)

In a similar manner gate insulation layer 54 and OFF-gate layer 56 are stacked on p type base layer 18. Thus, n channel MOSFET Q2' is formed which has n+ type layer 40 as a drain, and the upper surface regions of layers 18 and 26b positioned between layers 20 and 40 and disposed directly under gate insulation layer 54 as channel region CH2'. ON-gates 50 and 56 of FETs Q2 and Q2' are connected to gate turn-on controlling terminal G2, to which an external drive voltage for controlling the turn-off of thyristor 10 is applied. As described above, since electrode layer 32 is connected with n+ type layers 28 and 30, source (28) of ON-gate MOSFET Q1 is electrically conducted with p type layers 18 and 26a. Similarly, source 28' of MOSFET Q1' and layers 18 and 26b are electrically conducted with one another by electrode layer 32'. Therefore, layer 32 or 32' functions as an amplifying gate electrode.

The GTO thyristor of the construction described above was experimentally produced by the present inventors by a fabrication process which will be described below. An n type silicon wafer for forming layer 16 was first prepared. The resistivity of this wafer was 120 to 150 ohm-cm, and its thickness was set to 350 micrometers. Wafer 16 was subjected to the diffusion process of n type and p type impurities to thereby form n type base 14 of high concentration having 30 micrometers thick and p type emitter 12 of high concentration having 30 micrometers thick in one surface portion of wafer 16.

Subsequently, a p type impurity was diffused in the opposite surface portion of wafer 16 to form p type base layer 18. Then, a thermal oxidizing step was achieved to form gate insulation layers 36, 52 and 54 of 100 nanometer thick on the wafer. Polycrystalline silicon layers were deposited on layers 36, 52 and 54 to the abovementioned layers 34, 50 and 56. Then, with layers 34, 50, 56 as parts of masks, n type emitter 20, p type sub-bases 26a and 26b, and n+ type semiconductive layers 28, 30, 40 were sequentially formed on the surface portions of wafer 16. After an insulation layer was formed to cover the layers 34, 50 and 56, metallic layers 22 and 24 functioning as the anode and cathode electrodes, and metallic layer 32 serving as an amplifying gate electrode were formed to complete the GTO thyristor with independent turn-on/off controlling MOSFETs.

An operation mode relative to the turn-on/off control of the GTO thyristor of one embodiment of the present invention will be described. When thyristor 10 is to be turned on, a positive voltage is applied to common ON-gate terminal G1 of MOSFETs Q1 and Q1'. Thus, MOSFETs Q1 and Q1' are rendered conductive, and electrons are thus implanted from sources 28 and 28' of MOSFETs Q1 and Q1' through regions CH1 and CH1' to n type base layer 16. As a result, the source current of MOSFET Q1 is supplied through electrode layer 32 to p type base 18 and sub-base 26a. Simultaneously, the source current of MOSFET Q1' is supplied through layer 32' to p type base 18 and sub-base 26b. Therefore, GTO thyristor 10 can be turned on.

Alternatively, when GTO thyristor 10 is to be turned off, the potential of common terminal G1 of MOSFETs Q1 and Q1' is forcibly set to zero, and a positive voltage is applied to common terminal G2 of MOSFETs Q2 and Q2'. Thus, FETs Q1 and Q1' are rendered nonconductive, and MOSFETs Q2 and Q2' are rendered conductive. Therefore, n type emitter 20 of GTO thyristor 10 is conducted via regions CH2 and CH2' of MOSFETs Q2 and Q2' with drains 30 and 40 of MOSFETs Q2 and Q2'. Since drains 30 and 40 are always conducted with base 18 and sub-base 26 by electrode layer 32, n type emitter 20 is short-circuited with p type base 18 and sub-base 26. As a result, thyristor 10 can be turned off.

According to the embodiment device of the invention, p type base layer 18 of GTO thyristor 10 and p type sub-base layer 26 including the source of turn-on controlling MOSFET Q1 and the drain of turn-off controlling MOSFET Q2 are formed in independent fabricating steps to have different impurity concentrations. Therefore, the resistivity of p type base 18 of GTO thyristor 10 can be reduced without decreasing the resistivity of p type layer 26 corresponding to channel CH1 of MOSFET Q1. In other words, the resistivity of the p type channel region of MOSFET Q1 can be maintained high in desired degree, and yet the resistivity of p type base layer 18 can be sufficiently reduced without affecting adverse influence thereto. Channel CH2 of turn-off controlling FET Q2 is composed by the surface portion of base 18 of relatively high impurity concentration (low resistivity). Therefore, the turn-on performance of thyristor 10 can be maintained satisfactory and the erasing propagation of turn-off current of thyristor 10 can be accelerated without deteriorating the dv/dt rating and the basic characteristics of current capacity of thyristor 10. Consequently, the turn-off speed can be improved without deteriorating the turn-on performance of thyristor 10 to thereby improve the turn-off capability.

Since OFF-gate channel regions CH2 and CH2' are provided at both long sides of n type emitter 20 having a rectangular plan shape, the turn-off of GTO thyristor 10 simultaneously starts at both long sides of n type emitter 20. This means that the effective channel width for the turn-off current is long and hence a short-circuiting resistivity for turning off the thyristor 10 is extremely small. Therefore, time required for the entire turn-off current to completely disappear can be shortened to further improve the turn-off performance of GTO thyristor 10.

In the embodiment described above, the source current of MOSFET Q1 (or Q1') functions as the base current of GTO thyristor 10 which is turned on. Thus, the gate sensitivity of thyristor 10 can be improved in accordance with the same principle of the case of an amplifying gate thyristor.

Figure 3:
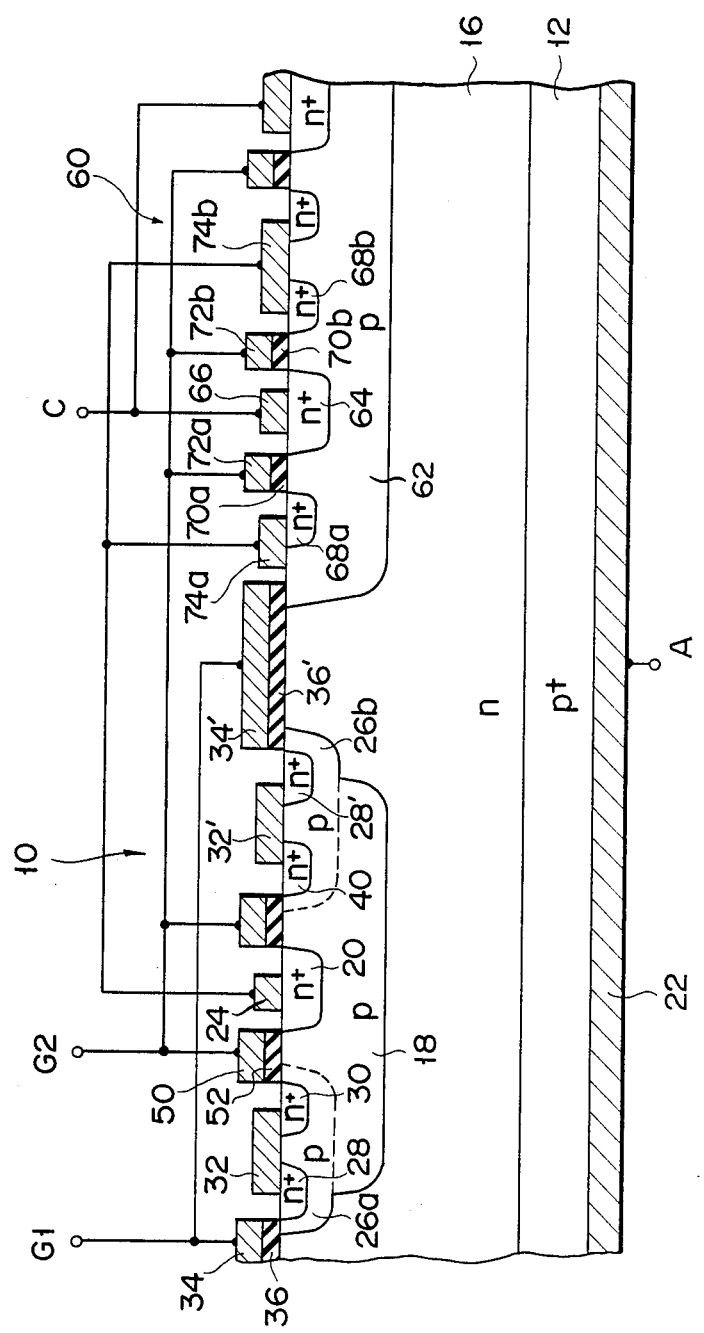
FIG. 3 is a sectional view of a semiconductor device including a main GTO thyristor and the GTO thyristor shown in FIG. 1 used as an auxiliary thyristor for driving the main GTO thyristor (not shown to scale)

Main thyristor 60 shown in FIG. 3 is turn-on driven in response to the turn-on operation of auxiliary thyristor 10. More specifically, when auxiliary thyristor 10 is turned on in the above-described manner, the cathode current of thyristor 10 is supplied as a base current through short-circuiting electrode layers 74a and 74b of main thyristor 60 to p type base layer 62 thereof. Main thyristor 60 is then turned on by the supply of the base current. On the other hand, when main thyristor 60 is turn-off driven, a positive voltage is simultaneously applied to OFF-gate terminal G2 of auxiliary thyristor 10 and OFF-gate electrodes 72a and 72b of main thyristor 60. Thus, auxiliary thyristor 10 is turned off in the above-described manner. At this time, in main thyristor 60, an n channel is formed under gate electrode 72 to short-circuit n type emitter 64 of thyristor 60 with p type base 62, thereby turning off thyristor 60. Therefore, according to the device in FIG. 3, since the base current of main thyristor 60 is amplified in two stages at the turn-on time of thyristor 60, the turn-on gate sensitivity of the GTO thyristor can be further improved as compared with the construction in FIG. 1.

Figure 4:
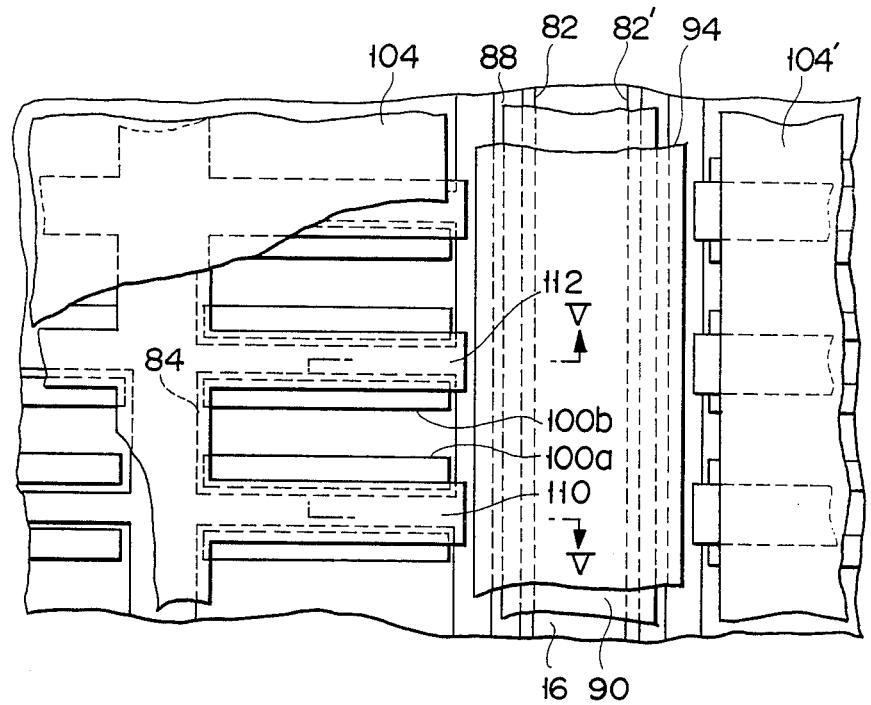
FIG. 4 shows in plan a GTO thyristor with turn-on/off controlling MOSFETs of different channel types in accordance with a second embodiment of the invention.
Figure 5:
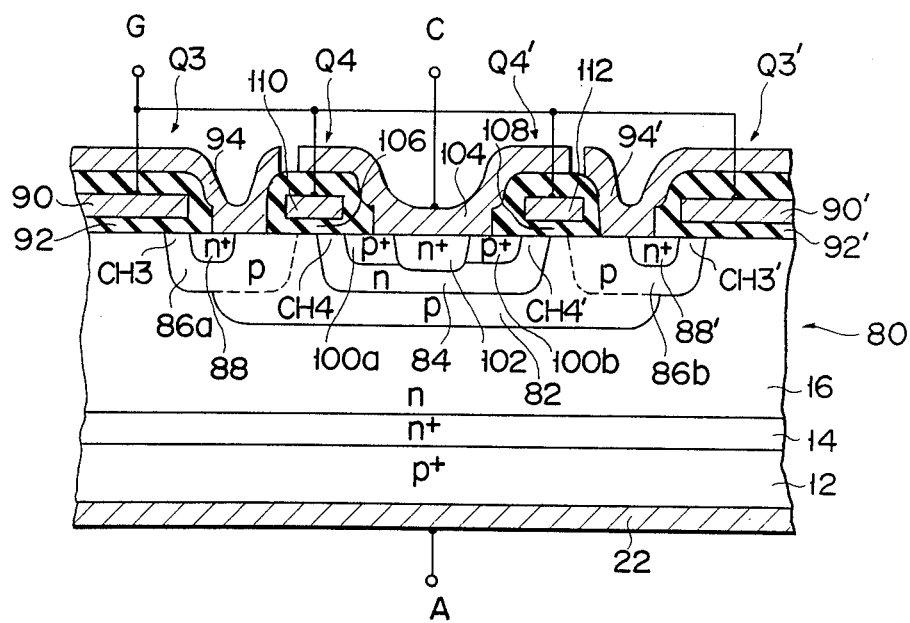
FIG. 5 is a sectional view of the GTO thyristor as taken along line V—V of FIG. 4 (not drawn to scale)

GTO thyristor 80 of a second embodiment of the present invention is shown in FIGS. 4 and 5. MOSFETs Q3 and Q4 of different channel types (i.e., n channel type and p channel type) are combined to form one MOS gate for controlling the turn-on/off of thyristor 80. In a sectional view of FIG. 5, the same reference numerals as in the first embodiment in FIG. 2 denote the same parts in the second embodiment, and the detailed description thereof will be omitted.

P type base layers 82 and 82' (only layer 82 is seen in FIG. 5) split in a similar manner to p type bases 18 and 18' of FIG. 1 and n type emitter layer 84 of high concentration having a rectangular slender plan shape are formed in n type base layer 16. P type layers 86a and 86b are formed to have different (smaller) impurity concentration in the diffusing step separately from the diffusing step for forming layer 82 at the short side of layer 82. Layers 86a and 86b function as a part of p type base. N type source layer 88 is formed in p type sub-base layers 86a and 86b (layer 88 in layer 86b is shown with a "dash" in FIG. 5).

Gate electrode layer 94 (i.e., an ON-gate) 90 is formed to extend straightly as shown in FIG. 4 and to cover the surface portion (channel region CH3) of p type sub-base layer 86a interposed between n type source 88 and n type base 16. ON-gate 90 is insulated from substrate 16 by gate insulation layer 92. Straight planar-shaped conductive layer 94 is formed insulatively above ON-gate 90. Layer 94 is also formed on wafer 16 to electrically connect p type base 86a and n type source 88 to thereby form n channel type conductivity modulation MOSFET Q3 for controlling the turn-on of thyristor 80. Other turn-on controlling n channel type conductivity modulation MOSFET Q3' has a construction similar to that of MOSFET Q3. MOSFETs Q3 and Q3' form an amplifying gate portion at turn-on time of thyristor 80 similar to the previous embodiment.

P type semiconductive layers 100a and 110b serving as source regions are formed in both side regions of the long sides of n type emitter 84 of GTO thyristor 80. N type semiconductive layer 102 of high concentration is formed to be in contact with source layers 100a and 100b in the central region of n type emitter 84. Conductive layer 104 is formed to directly contact layers 100a and 100b with layer 102 to function as cathode electrode C of thyristor 80. In FIG. 4, cathode C is formed to cover OFF-gates 110 and 112, though most is omitted for the purpose of simplification of illustration.

Gate insulation layer 106 is formed to cover the surface portion (channel region CH4) of n type emitter 84 interposed between one p type source 100a and p type base 82. Gate insulation layer 108 is formed to cover the surface portion (channel region CH4') of n type emitter 84 interposed between other p type source 100b and p type base 82. Conductive layers 110 and 112 are formed on insulation layers 106 and 108 to thereby form p channel type conductivity modulation MOSFETs Q4 and Q4' for controlling the turn-off of thyristor 80. As apparent from FIG. 4, conductive layers 110 and 112 are extended along long sides of n type emitter 84, and coupled with each other at a position not shown in FIG. 5 to function as the OFF-gates of thyristor 80. MOSFETs Q3 and Q3' form amplifying gate portions at turn-off time of thyristor 80 similarly to the previous embodiment. Gates (i.e., OFF-gates) 110 and 112 of MOSFETs Q3 and Q3' are connected in common to ON-gates 90 and 90' of MOSFETs Q3 and Q3', and connected to only one turn-on/off control terminal G. Since p type source layers 100a and 100b of MOSFETs Q4 and Q4' are connected by the cathode electrode 104 of thyristor 80 to n type layer 102 which functions as part of n type emitter 84, p type source layers 100a and 100b are always maintained at the same potential as emitter 84 of thyristor 80.

According to the second embodiment of the invention, when GTO thyristor 80 is turned on, a positive voltage is applied to gate terminal G. At this time, ON-gates 90 and 90' are excited, and n channel MOSFETs Q3 and Q3' are rendered conductive. As a result, the source current of MOSFETs Q3 and Q3' is supplied as a base current to p type base 82 of thyristor 80 to thereby turn on thyristor 80. The turn-on operation of thyristor 80 is similar to that in the first embodiment shown in FIG. 1. On the other hand, when thyristor 80 is turned off, gate terminal G is applied with a negative voltage. Thus, OFF-gates 110 and 112 are excited, and p channel MOSFETs Q4 and Q4' are rendered conductive. As a result, n type emitter 84 of thyristor 80 is short-circuited with base 82 to turn off thyristor 80.

According to this embodiment device, an FET having a channel type different from that of FET Q3 (or Q3') for controlling turn-on is used as turn-off controlling FET Q4 (or Q4'), thyristor 80 can be controlled to turn on or turn off by the application of a voltage to only one terminal. Therefore, the construction of the voltage application for controlling the turn-on/off of thyristor 80 can be simplified.

In a single control gate terminal construction, p channel regions CH4 and CH4', where the turn-off current of thyristor 80 starts flowing, are, unlike the abovementioned conventional device, to be in noncontact with n channel regions CH3 and CH3' of MOSFETs Q3 and Q3' of the ON-gate. Therefore, it can prevent the turn-off current from flowing simultaneously through n channel regions CH3 and CH3' of FETs Q3 and Q3' of the ON-gate. Further, since p type sub-base layer 86 which includes source 88 of turn-on controlling FET Q3 (or Q3') is formed by fabricating step separate from fabricating step of p type base layer 82 of the main body of thyristor 10, the resistivity of p type base 82 of thyristor 80 can be reduced to the desired degree without decreasing the resistivity of p type regions 86 for FETs Q3 and Q3'. The resistivity further decreases in the overlapped portion of base 82 and layers 86a and 86b. This contributes to the improvement in the turn-off capability by accelerating the erasing propagation of the turn-off current of thyristor 80 in layer 82.

In the embodiment device, the source current of conductivity modulation type MOSFET Q3 (or Q3') functions as the base current of GTO thyristor 80 at turn-on time, so that the gate sensitivity of thyristor 80 can be improved similarly to the previous embodiment.

Figure 6:
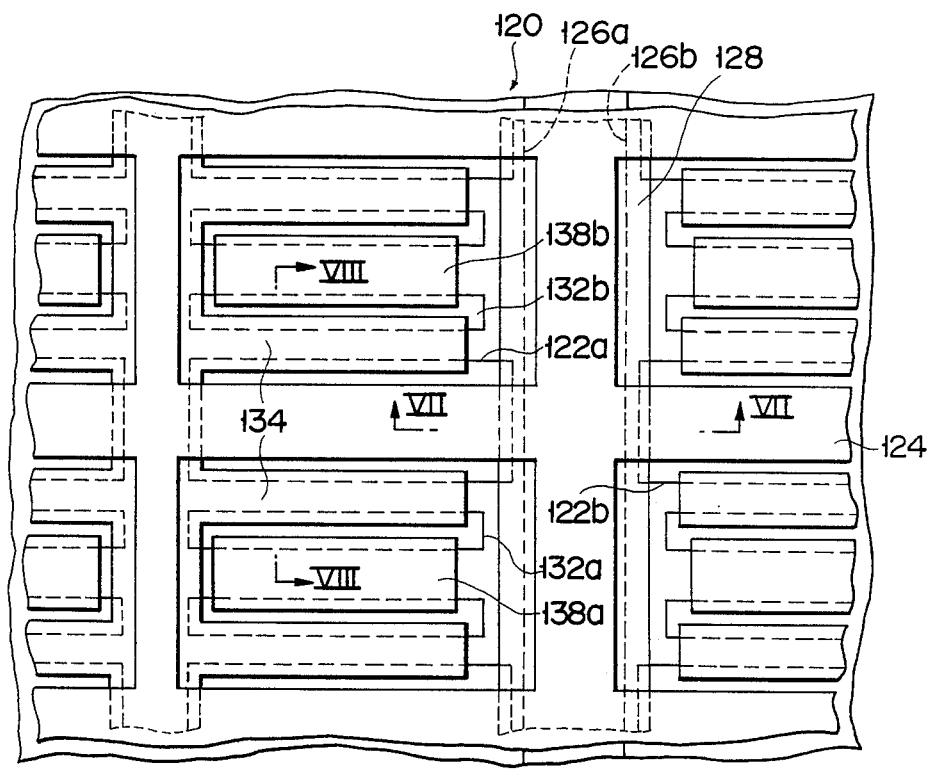
Figure 7:
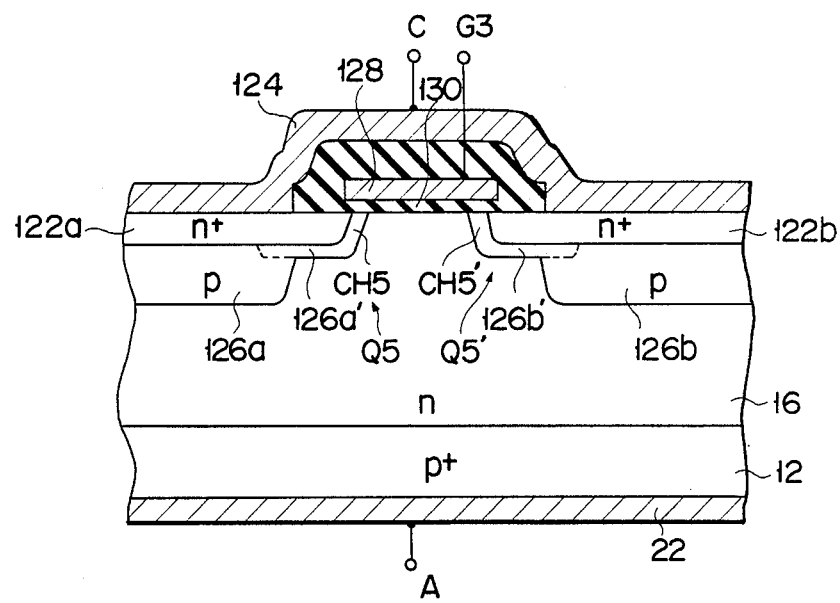
FIGS. 7, 8, 10 and 11 are sectional views of the GTO thyristors as taken along lines VII—VII and VIII—VIII of FIG. 6 and lines X—X and XI—XI of FIG. 6 (not drawn to scale)
Figure 8:
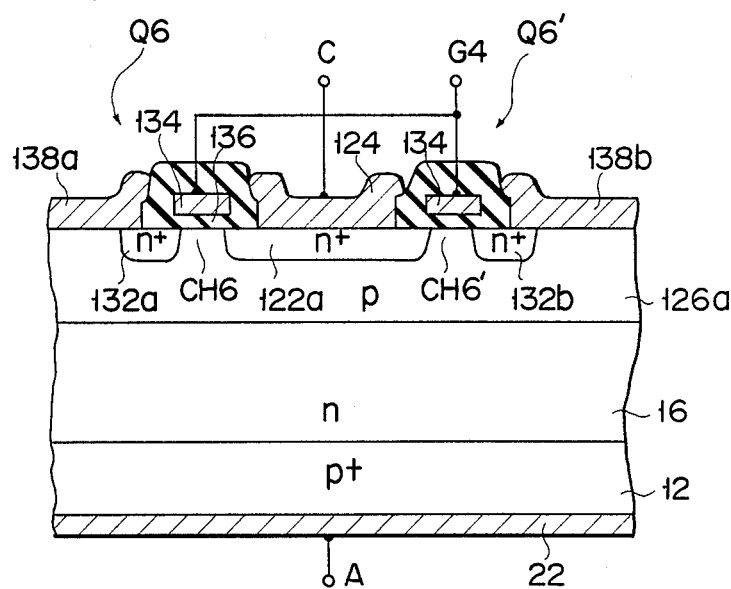

FIGS. 6 to 8 are diagrams showing the construction of GTO thyristor 120 including a plan arraying pattern according to a third embodiment of the invention. FIGS. 7 and 8 show sectional constructions as taken along line VII—VII and line VIII—VIII in plan view of FIG. 6. Thyristor 120 has the same channel type (e.g., n channel type) of MOSFETs Q5 and Q6 for independently controlling the turn-on/off of thyristor 120. Even in FIGS. 6 to 8, the same reference numerals as in the previous embodiments denote the same parts in the third embodiment, and the detailed description thereof will be omitted. However, in FIG. 6, insulation layers are omitted to readily understand visually the plan construction of the device having multilayer laminated structure.

The n type emitter of thyristor 120 is, as shown in FIG. 6, divided into a plurality of n type semiconductive layers 122a and 122b respectively having a rectangular planar shape. Conductive layer 124 which functions as cathode C is in contact with n type emitter layers 122a and 122b thereof, and has a mesh planar shape (see FIG. 6) to define rectangular openings or windows.

As best shown in FIG. 7, n type emitters 122a and 122b are diffused in p type base layers 126a and 126b divided similarly to thyristor 120. Layers 122a and 122b are opposed to one another at the short sides. Gate electrode layer 128 is formed on n type wafer or substrate 16 so as to be substantially self-aligned with layers 122a and 122b. Layer 128 is electrically insulated from layers 16, 122 and 126 by gate insulation layer 130. Therefore, turn-on controlling MOSFET Q5 (or Q5') of n channel type which has n type emitter 122 as source region, n type base 16 as drain region, and the surface portion of p type base 126 disposed between layers 122 and 16 to as channel region CH5 (or CH5') is composed. Since layer 128 is connected to turn-on control terminal G3, it functions as common ON-gate with FETs Q5 and Q5'.

High concentration n type semiconductive layers 132a and 132b are formed, as shown in FIG. 8, in p type base layer 126 to extend in parallel with long sides of n type emitter layer 122a. Conductive layer 134 is formed in a pectinated shape so as to have layer components substantially self-aligned with n type emitter 122a and n+ type layers 132a (or 132b) of thyristor 120. Layer 134 is insulated from layers 122, 126 and 132 by insulation layer 136. Therefore, turn-off controlling MOSFET Q6 (or Q6') which has conductive layer 134 as gate electrode, n type layer 132 as drain region and the surface portion of p type base 126 disposed between layers 122 and 132 as channel region CH6 (or CH6') is composed. FET Q6 (or Q6') is n channel type similarly to the turn-on controlling MOSFET Q5 (or Q5'). Gate electrode layer 134 is connected to turn-off control terminal G4 to function as common OFF-gate with FETs Q6 and Q6'. It should be noted that channel regions CH6 and CH6' of turn-off controlling MOSFETs Q6 and Q6' are formed along the long sides of rectangular n type emitter 122a, while channel region CH5 of turn-on controlling MOSFET Q5 is formed along short side of rectangular n type emitter 122a. Conductive layers 138a and 38b of rectangular planar shape are formed as a short-circuiting source electrode for contacting drains 132a and 132b of turn-off controlling MOSFETs Q6 and Q6' directly with p type base 126a. Since the other portions of the plan construction drawn in FIG. 6 are similar to the above, the detailed description thereof will be omitted.

The embodiment device was actually fabricated by the inventors of the present invention by fabricating steps as will be described below. N type silicon wafer (substrate), with 120 to 150 ohm-cm of specific resistivity and 350 micrometers thick, to become n type base 25 was first prepared. P type emitter 12 and p type base layers 126a and 126b of approx. 30 micrometers in depth were formed by high concentration diffusion technique in the surface portions of the silicon substrate. Then, gate insulation layers 130 and 136 were formed, for example, 100 nanometers thick in the surface portion of p type base layers 126 of the substrate by thermal oxidation process.

Subsequently, a polycrystalline silicon film of 500 nanometers thick was deposited to cover gate insulation layers 130 and 136, and ON-gate and OFF-gate layers 128 and 134 were formed to have a plan shape as has been described with reference to FIG. 6. With layer 128 as part of a mask, an impurity was implanted to p type base layers 126a and 126b to thereby form shallow p type semiconductive layers (which are designated by broken lines to intensify the point to become part of p type base layers 126a and 126b described above to be depicted as "126a' and 126b'" in FIG. 7) being lower than p type bases 126 in impurity concentration. P type semiconductive layers 126a' and 126b' function as channel regions CH5 and CH5' of turn-on controlling MOSFETs Q5 and Q5'. The reason why channel regions CH5 and CH5' of turn-on controlling MOSFETs Q5 and Q5' are formed in steps separately from steps of forming p type base layers 126 of GTO thyristor 120 is because the resistivity of p type base layer 126 (which includes channel regions CH6 and CH6' of turn-off controlling MOSFETs Q6 and Q6') is enabled to be set to a low value to the desired degree without decreasing the resistivity of channel regions CH5 and CH5' of turn-on controlling MOSFETs Q5 and Q5' similar to the case of the abovementioned first and second embodiments.

Thereafter, the step of diffusing n type impurity was performed to simultaneously form n type layer 122 which functions as n type emitter of thyristor 120 and n type drains 132 of turn-off controlling FETS Q6 and Q6'. (In order to reduce the resistivity of n type emitter layers 122, a part of n type layer 122 of high concentration may be formed before forming p type layers 126a' and 126b' for forming channel region CH5 and CH5'.) Subsequently, cathode electrode layer 124 and short-circuiting source electrode layers 138 were formed to complete GTO thyristor 120.

According to the third embodiment, when thyristor 120 is turned on, a positive voltage is applied to terminal G3 connected to ON-gate 128 of turn-on controlling FETs Q5 and Q5' substantially in a similarly manner as the first embodiment shown in FIGS. 1 and 2. Thus, FETs Q5 and Q5' are switched to be conductive, electrons are injected from n type emitter 122 to n type base 16, and thyristor 120 is turned on. On the contrary, when thyristor 120 is turned off, a positive voltage is applied to terminal G4 connected to OFF-gates 134 of turn-off controlling FETs Q6 and Q6' while maintaining the setting of the potential of terminal G3 to zero. As a result, FETs Q6 and Q6' become conductive, emitter 122 is short-circuited through off-channels CH6 and CH6' with n+ type layers 132a and 132b, short-circuited with p type base 126a by electrode layers 138a and 138b and thyristor 120 is accordingly turned off.

According to the third embodiment, a similar effect to that of the turn-off capability can be obtained without deteriorating the turn-on characteristics of the abovementioned GTO thyristor. As designated in FIG. 6, turn-on channels CH5 and CH5' are formed along the short side of n type emitter 122 of thyristor 120, and turnoff channels CH6 and CH6' are formed along the long side of n type emitter 122. Therefore, the channel width of turn-off controlling MOSFET Q6 (or Q6') can be increased to thereby further reduce the short-circuiting resistivity at turn-off time. According to the example experimentally manufactured by the inventors of the present invention, it was confirmed that a twice-higher peak turn-off current could be obtained, as compared with the GTO thyristor of the conventional construction. P type layers 126a' and 126b' for forming channel regions CH5 and CH5' of turn-on controlling FETs Q5 and Q5' were devised to form in steps separately from the steps of forming p type base layers 126a and 126b of the body of thyristor 120, to thereby produce merits in fabrication of enabling to simultaneously form ON-gate and OFF-gate. Consequently, only one patterning mask for patterning the ON-gate and OFF-gate may be sufficient.

Figure 10:
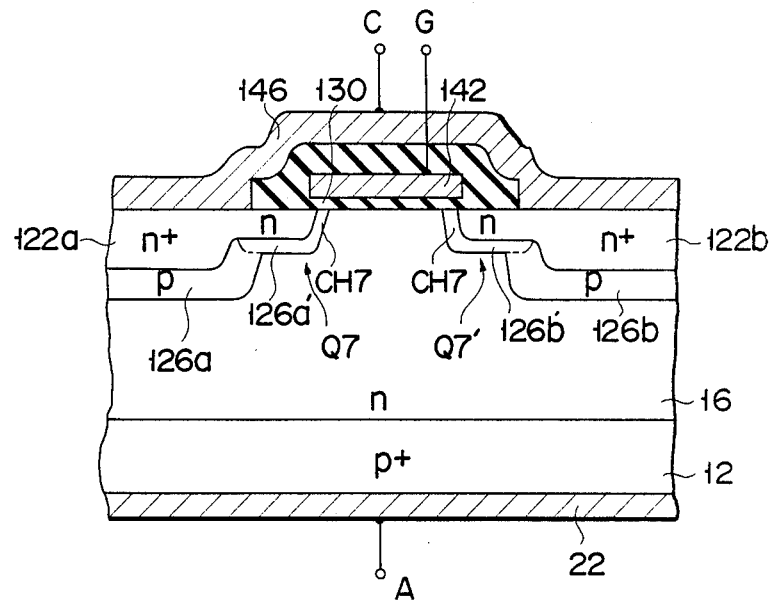
Figure 11:
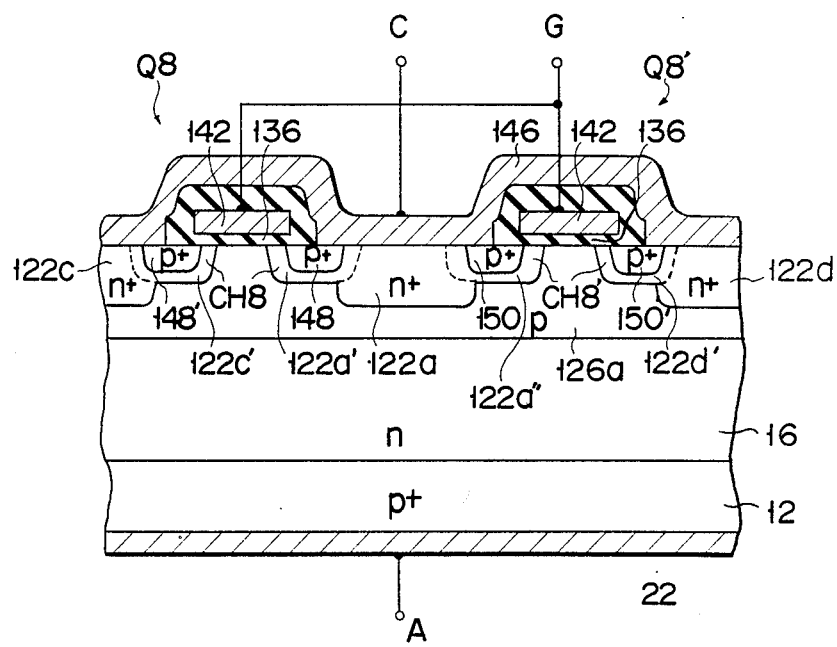

FIGS. 9 to 11 show a fourth embodiment of GTO thyristor 140 according to the invention. Thyristor 140 has MOSFETs Q7 and Q8 (these channel types are different from one another and ON-gate and OFF-gate are accordingly performed only by one gate electrode) for independently controlling the turn-on/off of thyristor 140. In these drawings, the reference numerals used in the previous embodiments denote the same parts in the fourth embodiment, and the detailed description thereof will be omitted. However, in FIG. 9, insulation layers are omitted to readily understand visually the plan construction of the device having a number of layer laminated structures, and broken lines for showing a lower layer structure are drawn only for the main portion of the plan construction of GTO thyristor 140.

In thyristor 140, n channel MOSFET Q7 is used as turn-on controlling element, and p channel MOSFET Q8 is used as turn-off controlling element. A plurality of n type emitters 122a and 122b having rectangular planar shape are dispersively formed in p type base layers 126a and 126b, formed oppositely to the surface portion of n type base 16. In FIG. 9, only two portions corresponding to p type bases are attached with "122a" and "122b", as can be observed in the sectional structure of FIG. 10.

Conductive layer 142 is formed above substrate 16 to have rectangular windows 144 arranged in a matrix shape. Each window 144 is disposed directly above corresponding n type emitter layer 122. Layer 142 is electrically insulated from layers 16, 122 and 126 by insulation layer 130, connected to turn-on/off control terminal G, and functions as a common gate of turn-on/off controlling FETs Q7 and Q8 of thyristor 140. Since turn-on controlling FETs Q7 and Q7' illustrated in the embodiment device in FIG. 10 have similar structure to that of the abovementioned n channel FETs Q5 and Q5', the reference numerals in the previous embodiment denote the same parts in the fourth embodiment, and the detailed description will be omitted. Cathode electrode layer 146 of thyristor 140 is provided to cover common gate layer 142 and layer 146 is accordingly formed to cover turn-on/off controlling FETS Q7 and Q8 of thyristor 140. However, in FIG. 9, much is omitted to readily understand visually the plan construction under cathode 146.

The sectional construction of turn-off controlling FETs Q8 and Q8' of p channel will be described with reference to FIG. 11. High concentration p type layers 148 and 148' are formed in long opposed sides of adjacent long n type emitters 122a and 122c. Similarly, high concentration p type layers 150 and 150' are formed in the long opposed sides of adjacent n type emitters 122a and 122d. N type layers 122a' (or 122a"), 122c' and 122d' of low impurity concentration are formed in the portion for forming layers 148 and 150 of n type emitter layers 122a to 122c in steps separately from the steps of forming n type emitters 122a to 122d, to have a different (smaller) impurity concentration. (Since N type layers 122a', 122a", 122c' and 122d' become parts of n type emitter layers 122, they are designated by broken lines in FIG. 11.)

Therefore, p channel type turn-off controlling MOSFET Q8 which has p type layers 148 and 148' as source, the surface portions of n type emitters 122a' and 122c' disposed between p type base 126a and layers 148 and 148' of thyristor 140 as channel (CH8), and layer 136 as gate is formed. Entirely similarly, p channel type turn-off controlling MOSFET Q8' which has p type layers 150 and 150' as source, the surface portions of emitter 122a" and 122d' disposed between p type base 126a and layers 150 and 150' as channel (CH8'), and layer 136 as gate is formed. It should be noted that since cathode layer 146 is formed to short-circuit n type emitters 122 with source layers 148, 148', 150 and 150' of p channel turn-off controlling FETS Q8 and Q8', it also functions as a short-circuiting of turn-off controlling FETS Q8 and Q8'. Thyristor 140 thus constructed to have different channel types in turn-on and turn-off controlling FETs Q7 and Q8 are turned on when a positive voltage is applied to the common gate terminal G, and turned off when a negative voltage is applied.

According to the fourth embodiment, FET Q8 or Q8' which becomes conductive in case of turn-off driving thyristor 140 is formed along the long side of rectangular n type emitter 122. Therefore, the turn-off performance of thyristor 140 can be improved similarly to the first embodiment described above.

Although the invention has been described with reference to specific embodiments, it should be understood by those skilled in the art that numerous modifications may be made that are within the spirit and scope of the invention.

Plan patterns of the abovementioned thyristors 10, 80, 120 and 140 may be variously modified. For example, it will be described with the thyristor of the third embodiment disclosed in FIGS. 6 to 8 as an example. The n type emitters have been divided into a plurality of rectangular n type layers 122a, 122b, 122c and 122d. However, as designated in FIG. 12, n type emitters 122a, 122b, 122c and 122d may be formed as an emitter layer designated by reference numeral 158 in FIG. 12.

Figure 12:
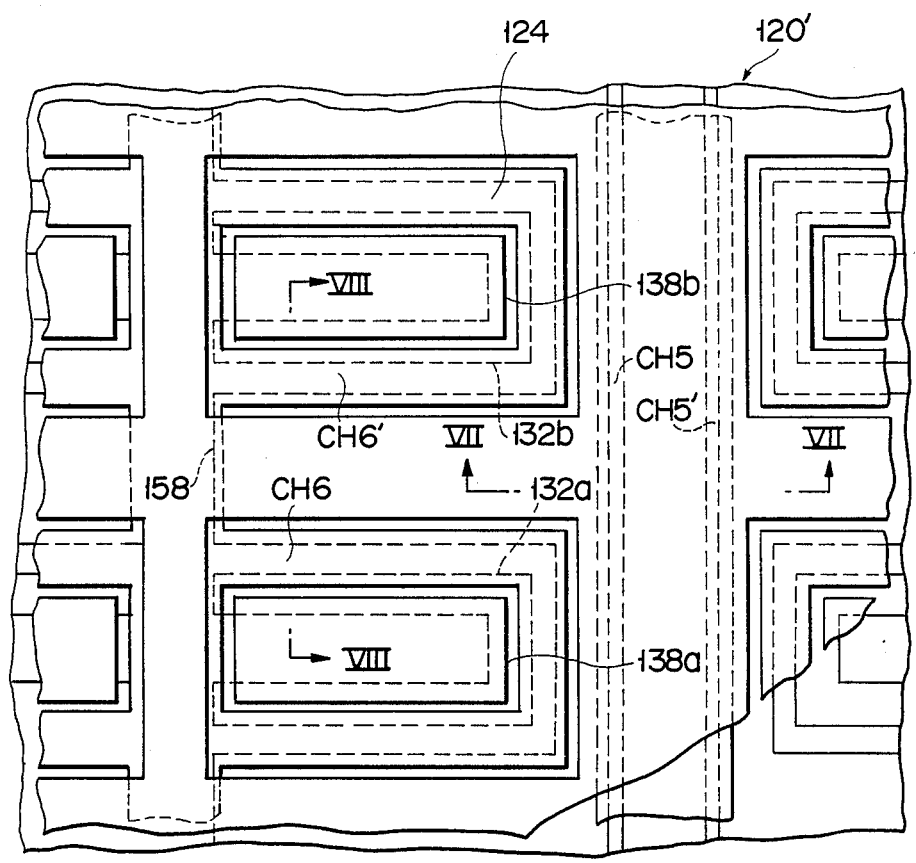
FIG. 12 is a plan view of a GTO thyristor which is a modification of the third embodiment thyristor shown in FIG. 6.

As was modified as described above, n type layer 132a (or 132b) which functions as the drain region of turn-off controlling FET Q6 (or Q6') is coupled at neighbouring n type layer at its short side to thereby have a planar shape of a square bracket ("laid U shape", designated by reference numerals "132a" or "132b" similar to FIG. 6 in FIG. 12). OFF-gate 124 of FET Q6 (or Q6') has a partial planar closed loop shape to planarly surround drain electrodes 138a and 138b. The sectional structure of the main portion of thyristor 120' having a thus modified planar pattern is, however, similar to that in FIGS. 7 and 8. Therefore, even in FIG. 12, similar line numbers "VII" and "VIII" to those used in FIG. 6 are used in the corresponding sectional lines.

According to modified thyristor 120', the width of ON-channel CH5 (or CH5') may be increased simultaneously while further increasing the channel width increased in off-channel CH6 (or CH6'). Therefore, since the channel region where the initial turn-on current of the GTO thyristor flows increases, the di/dt rating can be improved, and the current capacity can be accordingly improved. Further, since n type emitter 122 is integrally formed, the turn-on/off operation in the entire thyristor system can be equalized.

Figure 13:
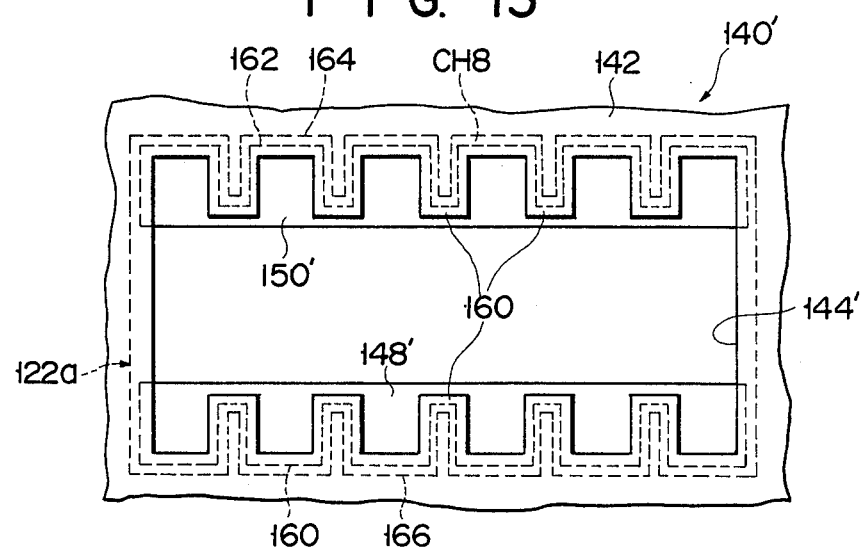
FIG. 13 is an expanded plan view of a modified layer pattern of a gate electrode of the fourth embodiment thyristor shown in FIG. 6.

FIG. 13 is a plan view showing in an enlarged state the essential portion of device 140' of the modified example of thyristor 140 of the fourth embodiment shown in FIGS. 9 to 11 (i.e., plan view in one window 144 of ON- and OFF-gate 142). As is apparent from this view, opening or window 144' of gate 142 is formed in a zigzag manner at the edges of the two long sides. Thus, gate layer 142 has a number of projection components 160 in window 144'. As the shape of layer 142 is modified, the sides of p+ type region 148 and 150 of turn-off controlling FETs Q8 and Q8' are formed in a zigzag shape as designated by broken lines "160" and "162" in FIG. 13. The two long sides of n type emitter 122a of the thyristor are similarly formed in a zigzag shape as designated by broken lines "164" and "166". Thus, the effective channel widths of turn-off controlling FETs Q8 and Q8' are increased to further improve the turn-off performance.

What is claimed is:

1. A gate turn-off thyristor comprising:
   (a) a semiconductor substrate of a first conductivity type serving as a first base layer;
   (B) a first emitter layer and a second base layer both of a seocnd conducitvity type, which are formed on opposing surfaces of said substrate;
   (c) a second emitter layer of the first conductivity type formed in said second base layer;
   (d) a first metal oxide semiconductor field effect transistor of a certain channel conductivity type for turning on said thyristor, said first transistor comprising,
   a first semiconductor layer of the first conductivity type formed in said second base layer to serve as a source of said first transistor and to define a surface portion of said second base layer positioned between itself and said first base layer as a channel region of said first transistor, and a first gate electrode layer insulatively provided above said first base layer to cover said channel region;

(e) a second metal oxide semiconductor field effect transistor of the same channel conductivity type as said first transistor, for short-circuiting said first base layer and said second emitter layer with each other thereby to turn off said thyristor, said second transistor being provided in said second base layer to be adjacent to said first transistor, said second transistor comprising, a second semiconductor layer of the first conductivity type formed in said second base layer to serve as a drain of said second transistor, said second semiconductor layer defining a surface portion of said second base layer positioned between itself and said second emitter layer as a channel region of said second transistor, and a second gate electrode layer insulatively provided above said channel region of said second transistor; and (f) a source electrode layer formed on said second base layer, for causing said source and said drain to be electrically conducted together with said second base layer, whereby said source electrode layer serves as an amplifying gate electrode of said first transistor, so that a source current of said first transistor acts as a base current of said thyristor to improve a gate sensitivity thereof;

wherein said second base layer comprises, an additional semiconductor layer of the second conductivity type formed in said substrate to overlap with said second base layer, said additional layer having a diffusion depth smaller than that of said second base layer, said first semiconductor layer being formed in said additional layer in such a manner that said channel region of said first transistor is defined in said additional layer to have a smaller diffusion depth than that of said channel region of said second transistor, and said first and second semiconductor layers are formed in said additional layer.

2. The gate turn-off thyristor according to claim 1, wherein said first and second gate electrode layer are voltage-driven independently of each other.

3. The gate turn-off thyristor according to claim 1, wherein said second emitter layer at least partially has a substantially rectangular slender planar shape defined by long and short sides, said source of said first transistor extends substantially parallel to the short sides of said second emitter layer, and said drain of said second transistor extends substantially parallel to the long sides of said second emitter layer, whereby said second transistor has a channel width greater than that of said second transistor.

4. The gate turn-off thyristor according to claim 1, further comprising:

a highly-doped semiconductive layer of the first conductivity type which is formed between said substrate and said first emitter layer to also serve as said first base layer.

* * * * *